United States Patent [19]

Lee et al.

[11] Patent Number: 5,057,711
[45] Date of Patent: Oct. 15, 1991

[54] NOISE REDUCING OUTPUT BUFFER CIRCUIT FOR AN INTEGRATED CIRCUIT

[75] Inventors: Jong S. Lee; Seung M. Kim, both of Kyungki; Joo W. Park, Chonlanam, all of Rep. of Korea

[73] Assignee: Hyundai Electronics Industries Co., Ltd., Kyungki, Rep. of Korea

[21] Appl. No.: 530,819

[22] Filed: May 30, 1990

[30] Foreign Application Priority Data

May 31, 1989 [KR] Rep. of Korea ............... 89-7378

[51] Int. Cl.$^5$ ......................................... H03K 19/094
[52] U.S. Cl. .................................... 307/443; 307/448; 307/473; 307/453; 307/542; 365/189.05
[58] Field of Search ............... 307/443, 481, 263, 448; 365/189.05

[56] References Cited

U.S. PATENT DOCUMENTS

| | | | |
|---|---|---|---|
| 3,906,255 | 9/1975 | Mensch, Jr. ............... | 307/448 |
| 4,604,731 | 8/1986 | Konishi ..................... | 365/189.05 |
| 4,724,340 | 2/1988 | Sood ......................... | 307/481 |
| 4,777,389 | 10/1988 | Wu et al. ................... | 307/448 |
| 4,918,339 | 4/1990 | Shigeo et al. .............. | 307/263 |
| 4,950,925 | 8/1990 | Doi et al. .................. | 307/481 |
| 4,954,729 | 9/1990 | Urai ........................... | 307/263 |
| 5,001,369 | 3/1991 | Lee ............................ | 307/473 |

FOREIGN PATENT DOCUMENTS 0032719 2/1989 Japan .......................... 307/448

Primary Examiner—Stanley D. Miller
Assistant Examiner—Scott A. Ouellette
Attorney, Agent, or Firm—Merchant, Gould, Smith, Edell, Welter & Schmidt

[57] ABSTRACT

An output buffer circuit for an integrated circuit for outputting an amplified signal from a sense amplifier which senses information stored in a memory cell of random access memory for improving operation of the integrated circuit is disclosed. The output buffer circuit comprises NAND gates ND1, ND2 operatively connected to the output of the sense amplifier to receive first and second output signals S1, S2, and operatively connected to receive a control signal $\phi 1$ from the integrated circuit which operates the memory cell to read. A MOSFET Q1 and a MOSFET Q2 are utilized with both MOSFETs turning on or off depending upon the signals applied to their gates. An output loading capacitor CL is operatively connected to the junction P4 and to the ground. A logic combination means 10 connected to junctions P1, P2 performs a logical combination of the signal applied through the junction P4 and the control signal $\phi 1$ applied to the input points of the logic combination means. An output means 20 is connected between the logic combination means 10 and the junction P4, thereby controlling the output level of the output buffer circuit to a middle level depending upon the signal from the logic combination means.

4 Claims, 5 Drawing Sheets

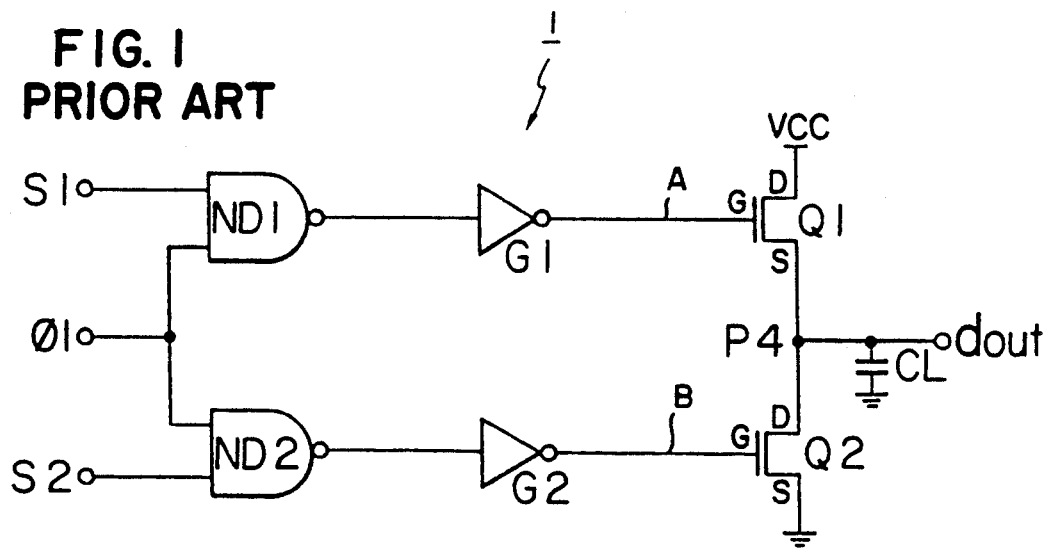
FIG. I
PRIOR ART
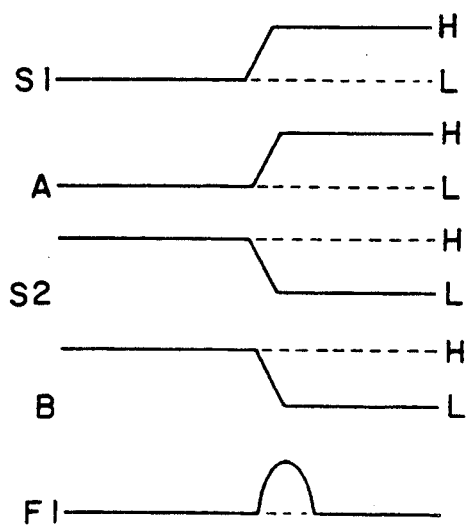
FIG. 2
PRIOR ART
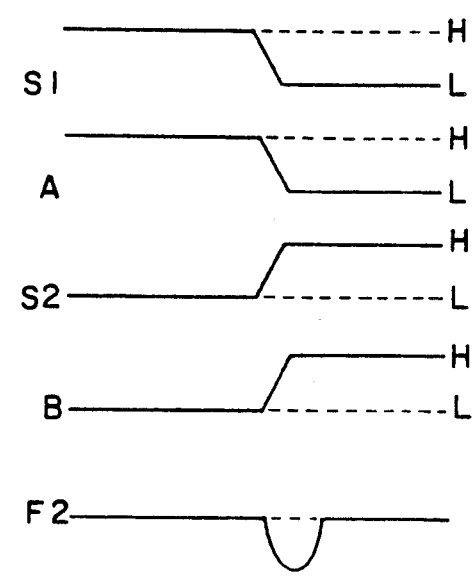
FIG. 3
PRIOR ART

NOISE REDUCING OUTPUT BUFFER CIRCUIT FOR AN INTEGRATED CIRCUIT

BACKGROUND OF THE INVENTION

1. Field of Invention

This invention relates to an output buffer circuit for an integrated circuit to reduce noise in the integrated circuit, and more particularly to an output buffer circuit for an integrated circuit which prevents an instantaneous increase in the current occurring in the output buffer circuit, thereby improving the operability of the integrated circuit.

2. Background Information

Generally, a RAM (Random Access Memory) comprises memory cells for storing information, sense amplifiers for sensing the information stored in the memory cells and output buffer circuits to output the amplified signals from the sense amplifier. When the state of the output is inverted in the output buffer circuit, a transitory high peak current flows, thereby causing noise in the entire integrated circuit. The noise results in a delay in the access time, thereby deteriorating the property of the integrated circuit.

Therefore, it is an object of the present invention to provide an output buffer circuit for an integrated circuit in which the instantaneous higher peak current produced when the output in the integrated circuit is inverted can be prevented by controlling an output voltage level from the output buffer circuit to a middle level just before the phase of the output is inverted.

Accordingly, the instantaneous higher peak current can be reduced by utilizing the output buffer circuit according to the invention.

An advantage to reducing the higher peak current according to the present invention is the alleviation of noise produced by the higher peak current when the state of output from the output buffer circuit is inverted, thereby improving the property of the integrated circuit.

SUMMARY OF THE INVENTION

For purposes of summarizing the present invention, it is an output buffer circuit for an integrated circuit for outputting an amplified signal from a sense amplifier which senses information stored in a memory cell of a random access memory, for improving operation of the integrated circuit, the output buffer circuit comprises NAND gates ND1, ND2 one input of each connected to output of the sense amplifier, respectively, to receive a first and second output signals S1, S2, and the remaining input of each connected, respectively, to receive a control signal $\phi 1$ from the integrated circuit which operates the memory cell to read. A MOSFET Q1 is utilized, with the gate electrode connected to the output of the NAND gate ND1 through an inverting gate G1, the drain electrode connected to a voltage source Vcc, and the source electrode connected to a junction P4. A MOSFET Q2 is utilized with the gate electrode connected to the output of the NAND gate ND2 through an inverting gate G2, the drain electrode connected to the junction P4; and the source electrode connected to ground, both MOSFETs turning on or off depending upon the signals applied to their gates. An output loading capacitor CL, one end operatively connected to the junction P4 and the other operatively connected to ground, is employed. A logic combination means 10 is connected to junctions P1, P2 as its inputs point to perform a logical combination of the signal applied through the junction P4 and the control signal $\phi 1$ applied to the inputs point of the logic combination means. An output means 20 is connected between the logic combination means 10 and the junction P4, thereby controlling the output level of the output buffer circuit to a middle level depending upon the signal from the logic combination means.

Preferably, the logic combination means comprises a NOR gate NOR1 for logically combining the level of the control signal $\phi 1$ from the junction P1 to which one input of the NOR gate NOR1 is connected, and the level of the signal from the junction P4 to which the other input of the NOR gate NOR1; and a NOR gate NOR2 for logically combining the level of the control signal $\phi 1$ from the junction P2 to which one input of the NOR gate NOR2 is connected, and the level of the signal from an inverting gate G3 through which the other input of the NOR gate NOR2 is connected to the junction P4.

The preferred embodiment of the output means utilizes a MOSFET Q3 with the gate electrode connected to the output of the NOR gate NOR 1 in the logic combination means, the drain electrode connected to a voltage source Vcc, and the source electrode connected to a junction P3 which is connected to the junction P4; and a MOSFET Q4 with the gate electrode connected to the output of the NOR gate NOR 2 in the logic combination means, the drain electrode connected to the junction P3, and the source electrode connected to ground, with each MOSFETs Q3, Q4 tuning on or off depending upon the signals applied to the gates thereof.

BRIEF DESCRIPTION OF THE DRAWINGS

For fuller understanding of the nature and objects of the invention, reference should be made to the following detailed description taken in conjunction with the accompanying drawings in which:

FIG. 1 illustrates a circuit diagram of an output buffer circuit for an integrated circuit according to the prior art;

FIG. 2 and FIG. 3 illustrate a plurality of voltage wave forms produced in the output buffer circuit illustrated FIG. 1;

Figure 4:
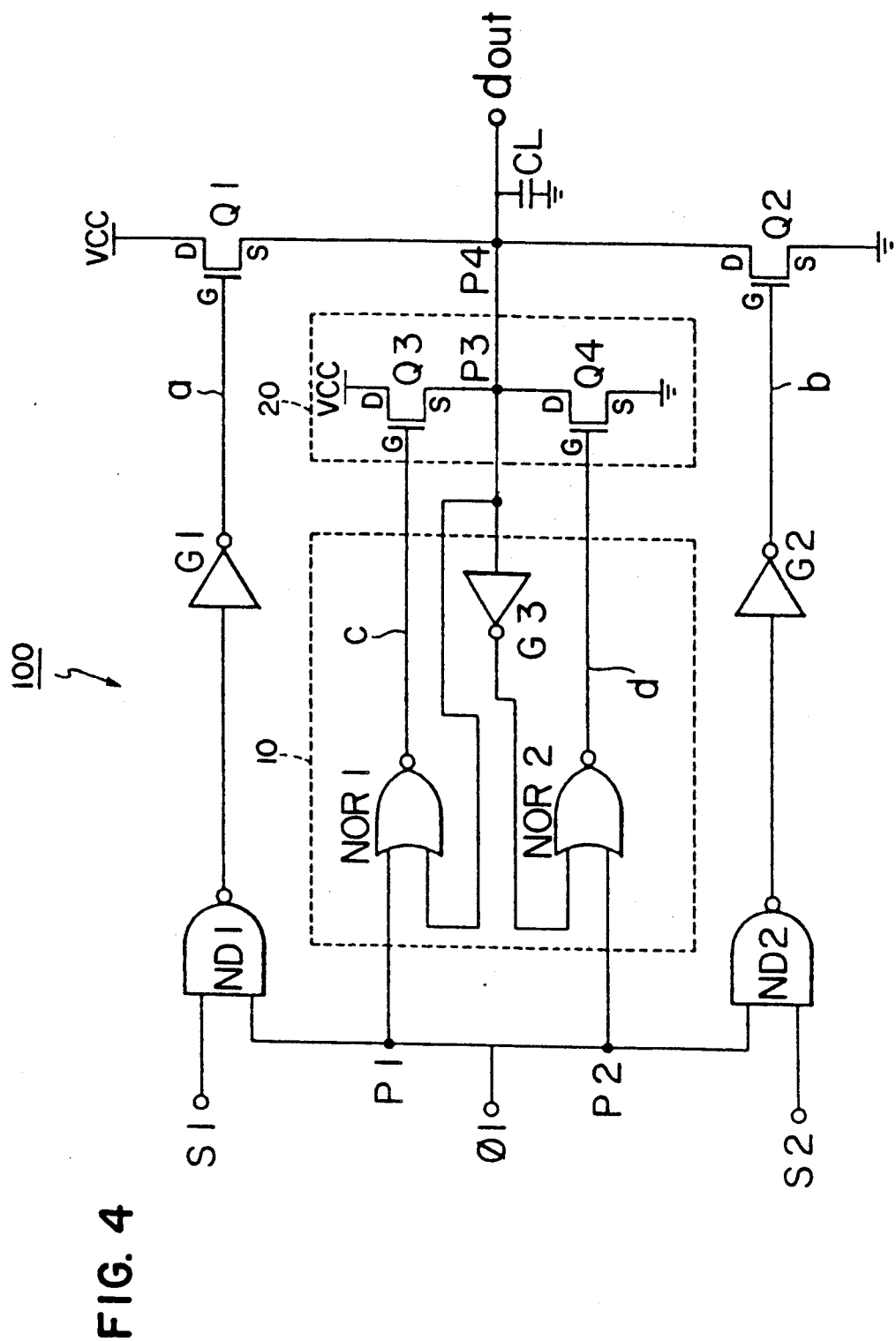
FIG. 4 illustrates the circuit diagram of the output buffer circuit for an integrated circuit according to the present invention.

The novel feature of the present invention may be understood from the accompanying description when taken in conjunction with the accompanying drawings.

DETAILED DESCRIPTION

FIG. 1 illustrates a prior art output buffer circuit 1. The operation and construction thereof will be described in conjunction with FIGS. 2 and 3.

NAND gate ND1 and NAND gate ND2 are controlled by a control signal $\phi 1$ applied to the respective input thereof from an integrated circuit which is not shown in the drawing. NAND gate ND1 and NAND gate ND2 perform the logical combination of the control signal φ1 together with a first output signal S1 and a second output signal S2 from sense amplifiers (not shown) which are applied to the respective other inputs of the NAND gates ND1, ND2, respectively. The control signal φ1 is always maintained at a high level when the RAM memory (not shown) is selected to read. The output signals from the NAND gates ND1, ND2 are coupled to gate electrodes of MOSFETs Q1, Q2 of the output buffer circuit, respectively, through the respective inverting gates G1, G2 so that the MOSFET Q1 or MOSFET Q2 is conductive depending upon the level of the signal applied thereto. On other hand, a drain electrode of the MOSFET Q1 is connected to a voltage source Vcc. A source electrode of the MOSFET Q1 and a drain electrode of the MOSFET Q2 are connected to each other at junction P4 and are then connected to an output terminal dout. An output loading capacitor CL, which is connected to ground, is connected between junction P4 and the output terminal dout. Thus, as illustrated in FIG. 2 and FIG. 3, if the sense amplifier operates normally, the first output signal S1 and the second output signal S2 from the sense amplifier always have an opposite logic level relative to each other.

In the waveforms illustrated in FIG. 2, when the first output signal S1 changes from a logic "low" level to a logic "high" level, the second output signal S2 changes from a logic "high" level to a logic "low" level. Thus, if the control signal φ1 is high, the MOSFET Q2 turns off and the MOSFET Q1 turns on, thereby charging the output loading capacitor CL to a voltage, Vcc. At this time, a relatively higher level of peak current momentarily flows as illustrated in the waveform F1 of FIG. 2.

Also, in the waveforms illustrated in FIG. 3, when the first output signal S1 from the sense amplifier changes from a logic "high" level to a logic "low" level, the second output signal S2 from the sense amplifier changes from a logic "low" level to a logic "high" as shown in the waveform S2 of FIG. 3. Thus, the MOSFET Q1 turns off and the MOSFET Q2 turns on, thereby discharging the high level voltage, Vcc stored in the output loading capacitor CL to ground through the MOSFET Q2. At this time, a relatively higher level of peak current F2 momentarily flows as illustrated in the waveform F2 of FIG. 3. Therefore, the prior art circuit constructed as described above presents a disadvantage in that the higher level of peak current causes transitory noise in the integrated circuit.

FIG. 4 illustrates the output buffer circuit 100 for integrated circuit according to the present invention. The construction and operation thereof will be described in conjunction with the waveforms illustrated in FIG. 5 and FIG. 6.

A first output signal S1 and a second output signal S2 from a sense amplifier, not shown in the drawing, are applied to one of the respective input terminals of a NAND gate ND1 and a NAND gate ND2, and the remaining input terminals of both NAND gate ND1 and NAND gate ND2 are connected to receive the output from an integrated circuit, not shown, as a control input signal φ1. The output terminals of the NAND gate ND1 and NAND gate ND2 are connected to gate electrodes of MOSFET Q1 and MOSFET Q2, respectively, through inverting gates G1, G2. The source electrode of MOSFET Q1 and the drain electrode of MOSFET Q2 are connected to each other at junction P4 while the drain electrode of MOSFET Q1 is connected to a voltage source, Vcc and the source electrode of MOSFET Q2 is connected to ground.

On the other hand, the control signal φ1 applied to one of the inputs of the NAND gates ND1, ND2 is also applied to inputs of a logic combination means 10 through its input point P1, P2. The logic combination means 10 comprises NOR gate NOR1, NOR2 the outputs of which are connected to gate electrodes of pull-up and pull-down MOSFET Q3, Q4, respectively. The source electrode of MOSFET Q3 and the drain electrode of MOSFET Q4 are connected to each other at junction P3. The drain electrode of MOSFET Q3 is connected to the voltage source Vcc, and the source electrode of MOSFET Q4 is connected to ground.

An output means 20 preferably comprises MOSFETs Q3 and Q4, which are operatively connected at the junction P3. The junction P3 is positioned between the source electrode of MOSFET Q3 and the drain electrode of MOSFET Q4. The output means 20 is also connected to the junction P4 between the source electrode of MOSFET Q1 and the drain electrode of MOSFET Q2, and the junctions P3, P4 are connected to ground through the output loading capacitor CL. At the same time, the junctions P3, P4 are connected to an input of inverting gate G3 the output of which is connected one input of the NOR gate NOR2, and are also connected to one input of the NOR gate NOR1.

As described above, when the control signal φ1 changes from "high" level to "low" level during the time interval T1 to T2 before the first output signal S1 from the sense amplifier changes from "low" level to "high" level and the second output signal S2 from the sense amplifier changes from "high" level to "low" level, the signals at nodes (a), (b) become "low" level so that the MOSFETs Q1, Q2 turn off. At the same time, the signal level at a node (c) during the interval becomes "high", thereby turning the MOSFET Q3 on. As result of this, the output loading capacitor CL is firstly precharged by a portion of the voltage Vcc as shown in F3 of FIG. 5. Under this condition, when, after the interval, the control signal φ1 changes from "low" level to "high" level and the first output signal S1 from the sense amplifier changes from "low" level to "high" level and the second output signal S2 from the sense amplifier changes from "high" level to "low" level, the signal at node (a) becomes "high" level so that the MOSFET Q1, turns on while the signal at node (b) becomes "low" so that the MOSFET Q2 turns off. Accordingly, the output loading capacitor CL is finally charged by the voltage, Vcc.

As described above, the output loading capacitor CL is firstly precharged by a portion of the voltage, Vcc during the time interval T1 to T2 when the control signal φ1 is "low" level, and then finally charged by the voltage, Vcc again. That is, the output loading capacitor CL is charged step by step as illustrated in dout of FIG. 5, thereby preventing an instantaneous higher peak current produced when the output capacitor CL is charged only once according to the prior art.

Figure 5:
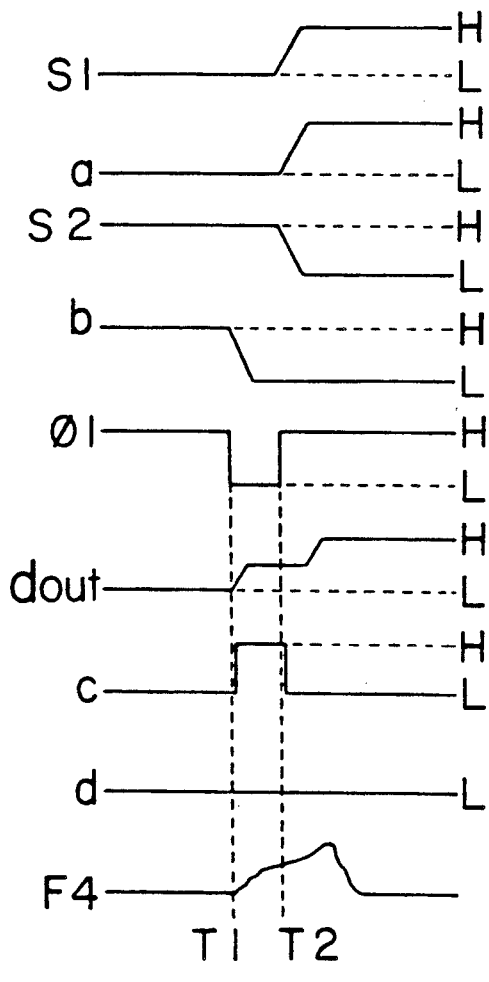
FIG. 5 and FIG. 6 graphically illustrate voltage wave forms produced in the output buffer circuit illustrated in FIG. 4.

FIG. 5 illustrates a plurality of waveforms of signals which are useful to explain the charging of the output loading capacitor CL.

Figure 6:
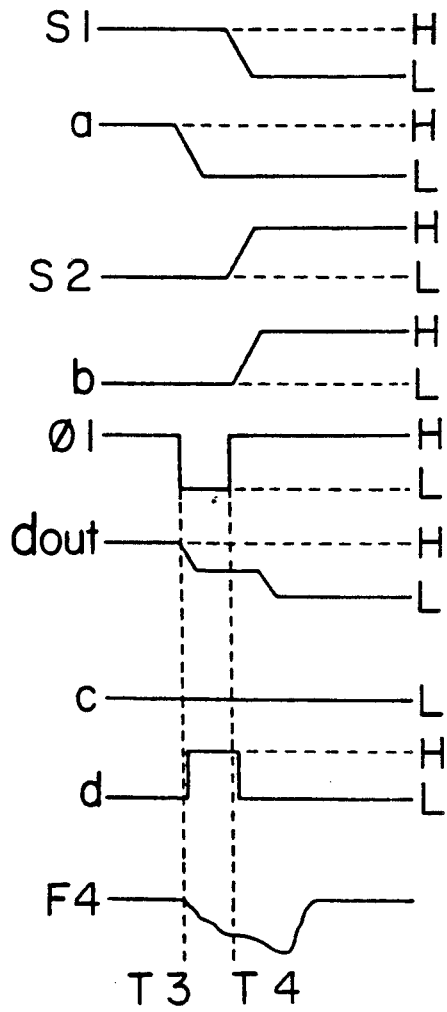

On the contrary, FIG. 6 illustrates a plurality of waveforms of signals which are useful in explaining the discharging of the output loading capacitor CL step by step.

When a control signal φ1 changes from "high" level to "low" level during the time interval T3 to T4 before a first output signal S1 from a sense amplifier, not shown, changes from "high" level to "low" level and a second output signal S2 from the sense amplifier changes from "low" level to "high" level, the respective level of signals at nodes (a), (b) become "low" level so that the MOSFETs Q1, Q2 turn off. Also, the MOSFET Q3 turns off while the MOSFET Q4 turns on. Thus, a potion of the voltage Vcc stored in the output loading capacitor CL is firstly discharged through ground.

After time T4, when the control signal φ1 changes from "low" level to "high" level, and the first output signal S1 from the sense amplifier changes from "high" to "low" level, and the second output signal S2 from the sense amplifier changes from "low" level to "high" level, the level of the signal at the node (a) remains "low" level. Thus, the MOSFET Q1 turns off. On the other hand, the level of the signal at node (b) becomes "high" so that the MOSFET Q2 turns on. Therefore, the remaining voltage Vcc charged in the output loading capacitor CL is finally discharged through ground. That is, as can be seen from the waveform dout illustrated in FIG. 6, the voltage stored in the output loading capacitor CL is discharged step by step so that the instantaneous higher peak current, which is produced when the voltage stored in the output loading capacitor CL and instantly discharged, can be reduced.

A waveform F4 illustrated in FIG. 6 depicts a sequential or step by step discharge of the current from the output loading capacitor CL.

Figure 7:
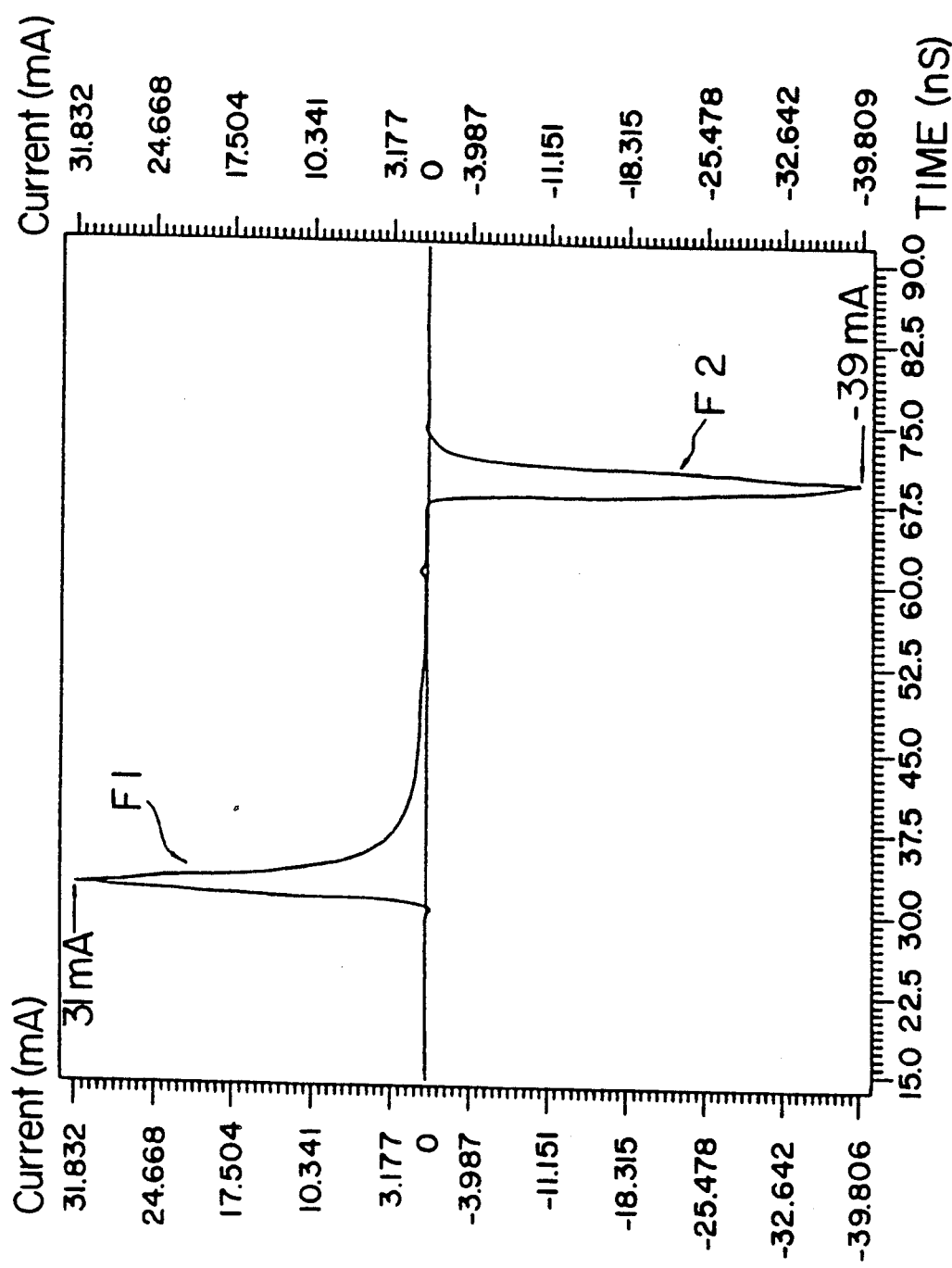
FIG. 7 illustrates a simulated graphic representation of property of a peak current of the output buffer circuit illustrated FIG. 1 according to the prior art.

FIG. 7 illustrates a simulated graphic representation of the higher peak current of the prior art output buffer circuit illustrated at FIG. 1.

For example, it is assumed that the voltage source Vcc is 5 V. Accordingly, as the output loading capacitor CL is charged by Vcc, i.e. 5 V starting from "0", a wave form F1 of the peak current, 31 mA flows at the time, 32.25 nS (nano second) after the voltage, 5 V is applied, while a wave form F2 of the current, −39 mA flows at the time, 69.75 nS when the voltage, Vcc stored in the output loading capacitor CL is discharged. Here, the negative sign (−) means that the discharging current flows in opposite direction to the direction of the charging current.

Figure 8:
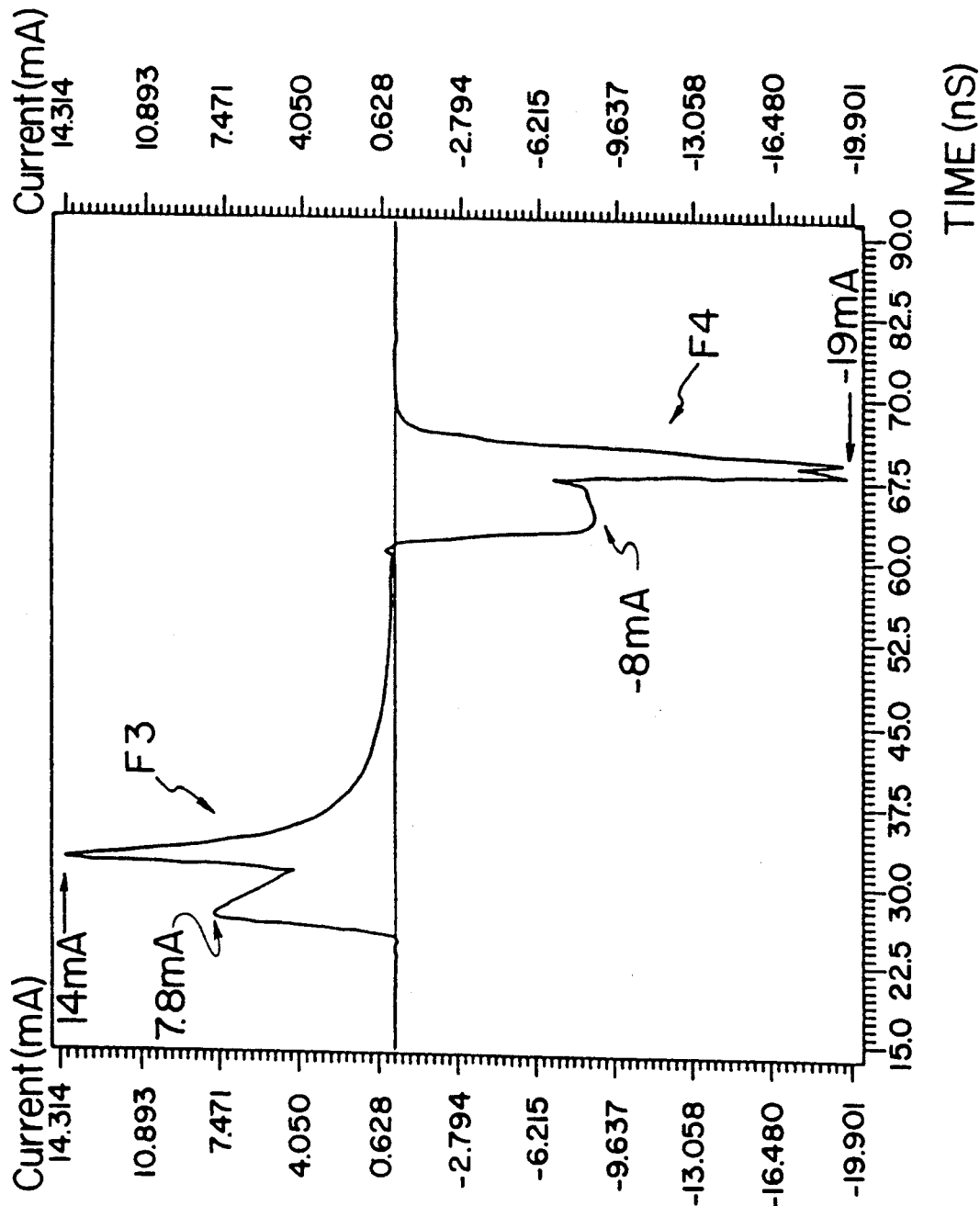
FIG. 8 illustrates a simulated graphic representation of property of a peak current of the output buffer circuit illustrated in FIG. 4 according to the invention.

FIG. 8 illustrates a simulated graphic representation of the peak current of the output buffer circuit 100 of the present invention illustrated in FIG. 4.

For example, it is assumed that voltage source Vcc is 5 V and the other conditions are the same as in the prior art. According to the present invention, as the output loading capacitor CL is precharged by the voltage, Vcc starting from "0" volt, the first peak current, 7.8 mA flows at the time, 26.25 nS after the voltage, Vcc is applied, and under this condition, when the output loading capacitor CL is recharged by the voltage, Vcc, the second peak current, 14 mA flows at the time, 32.25 nS. On the other hand, when the voltage charged in the output loading capacitor CL by the voltage Vcc is discharged, a first peak current, for example, −8 mA at the time, 63.75 nS flows and then a second peak current, for example, −19 mA at the time, 68.25 nS flows.

It apparently shows that wave forms F3 and F4 of the each peak current of the waveform, illustrated in FIG. 8, obtained by utilizing the output buffer circuit according to the present invention is lower than the highest peak current, that is, wave forms F1 and F2 of the each peak current in the waveform illustrated in FIG. 7.

With the improvement of an output buffer circuit for integrated circuit according to the present invention, it is possible to prevent an instantaneous higher current, thereby reducing noise in the integrated circuit.

As described above, since the output buffer circuit according to the present invention can reduce the peak current output substantially 50% and the output signal from the output buffer circuit reaches a high level always through a middle level, the access speed of the integrated circuit is greatly increased.

The foregoing description of the preferred embodiment has been presented for the purpose of illustration and description. It is not intended to limit the scope of this invention. Many modifications and variations are possible in the light of the above teaching. It is intended that the scope of the invention be defined by the claims.

What is claimed is:

1. An output buffer circuit to reduce noise in an integrated circuit for outputting an amplified signal from a sense amplifier which senses information stored in a memory cell of a random access memory, the output buffer circuit comprising:

NAND gates (ND1, ND2) one input of each connected to output of the sense amplifier, respectively, to receive a first and second output signals (S1, S2), and the remaining inputs connected, respectively, to receive a control signal (φ1) from the integrated circuit which operates the memory cell to read;

MOSFET (Q1) with a gate electrode connected to the output of the NAND gate (ND1) through an inverting gate (G1), with a drain electrode connected to a voltage source (Vcc), and with source electrode connected to a junction (P4);

MOSFET (Q2) with gate electrode connected to the output of the NAND gate (ND2) through an inverting gate (G2), with drain electrode connected to the junction (P4), and with source electrode connected to ground, both MOSFETs turning on or off depending upon the signals applied to their gates;

an output loading capacitor (CL), one end of which is connected to the junction (P4) and the other end is connected to ground;

a logic combination means (10) for performing a logical combination of the signal from the junction (P4) and the control signal (φ1), the inputs of which are connected to the junction (P4) for receiving the output signal and junctions (P1, P2) for receiving the control signal (φ1); and, an output means (20) for providing a middle level of the peak of the output level of the junction (P4) in the output buffer circuit in response to the signal from the logic combination means.

2. The output buffer circuit of claim 1 wherein said logic combination means comprises:

a NOR gate (NOR1) for logically combining the level of the control signal (φ1) from the junction (P1) to which one input of the NOR gate (NOR1) is connected, and the level of the signal from the junction (P4) to which the other input of the NOR gate (NOR1) is connected; and, a NOR gate (NOR2) for logically combining the level of the control signal (φ1) from the junction (P2) to which one input of the NOR gate (NOR2) is connected, and the level of the signal from an inverting gate (G3) through which the other input of the NOR gate (NOR2) is connected to the junction (P4).

3. The output buffer circuit of claim 1 wherein said output means comprises:
- a MOSFET (Q3) with gate electrode connected to the output of the NOR gate (NOR1) in the logic combination means, with drain electrode connected to a voltage source (Vcc), and with source electrode connected to a junction (P3) which is connected to the junction (P4); and,
- a MOSFET (Q4) with gate electrode connected to the output of the NOR gate (NOR2) in the logic combination means, with drain electrode connected to ground, with each of MOSFETs (Q3, Q4) turning on or off depending upon the signals applied to the gates thereof.

4. An output buffer circuit for an integrated circuit for outputting an amplified signal from a sense amplifier which senses information stored in a memory cell of random access memory, the output buffer circuit comprising:
- NAND gates (ND1, ND2) one input of each connected to output of the sense amplifier, respectively, to receive a first and second output signals (S1, S2), and each remaining input connected, respectively, to receive a control signal ($\phi 1$) which operates the memory cell to read;
- MOSFET (Q1) with gate electrode connected to the output of the NAND gate (ND1) through an inverting gate (G1), with drain electrode connected to a voltage source (Vcc), and with source electrode connected to a junction (P4);
- MOSFET (Q2) with gate electrode connected to the output of the NAND gate (ND2) through an inverting gate (G2), with drain electrode connected to the junction (P4), and with source electrode connected to ground, both MOSFETs turning on or off depending upon the signals applied to their gates;
- an output loading capacitor (CL), one end of which is connected to the junction (P4) and the other end is connected to ground;
- a logic combination means to logically combine the level of the control signal ($\phi 1$) and the level of the junction (P4), the logic combination means comprises a NOR gate (NOR1) for logically combining the level of the control signal ($\phi 1$) from a junction (P1) to which one input of the NOR gate (NOR1) is connected, and the level of the signal from the junction (P4) to which the other input of the NOR gate (NOR1) is connected; and a NOR gate (NOR2) for logically combining the level of the control signal ($\phi 1$) from a junction (P2) to which one input of the NOR gate (NOR2) is connected, and the level of the signal from an inverting gate (G3) through which the other input of the NOR gate (NOR2) is connected to the junction (P4); and,
- an output means connected between the logic combination means and the junction (P4), the output means comprises a MOSFET (Q3) with gate electrode connected to the output of the NOR gate (NOR1) in the logic combination means, with drain electrode connected to a voltage source (Vcc), and with source electrode connected to a junction (P3) which is connected to the junction (P4); and a MOSFET (Q4) with gate electrode connected to the output of the NOR gate (NOR2) in the logic combination means, with drain electrode connected to the junction (P3), and with source electrode connected to ground, with each of MOSFETs (Q3, Q4) turning on or off depending upon the signals applied to the gates thereof, thereby controlling the output level of the output buffer circuit to a middle level depending upon the signal from the logic combination means.

* * * * *